US008124457B2

(12) United States Patent
Oda et al.

(10) Patent No.: US 8,124,457 B2
(45) Date of Patent: Feb. 28, 2012

(54) MANUFACTURING METHOD OF TRANSFERRING A WIRING CIRCUIT LAYER ON A METAL SUPPORT SUBSTRATE TO A SEMICONDUCTOR ELEMENT

(75) Inventors: Takashi Oda, Ibaraki (JP); Shigenori Morita, Ibaraki (JP); Naoko Yoshida, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 5 days.

(21) Appl. No.: 12/634,350

(22) Filed: Dec. 9, 2009

(65) Prior Publication Data
US 2010/0151629 A1    Jun. 17, 2010

(30) Foreign Application Priority Data
Dec. 11, 2008    (JP) .................................. 2008-316076

(51) Int. Cl.
*H01L 21/00* (2006.01)
(52) U.S. Cl. .. 438/118; 438/616; 257/678; 257/E21.506
(58) Field of Classification Search .......................... None
See application file for complete search history.

(56) References Cited

U.S. PATENT DOCUMENTS

| | | | | |
|---|---|---|---|---|
| 5,448,014 A | * | 9/1995 | Kong et al. ..................... | 174/539 |
| 6,391,220 B1 | * | 5/2002 | Zhang et al. .................... | 216/67 |
| 6,908,856 B2 | * | 6/2005 | Beyne et al. .................. | 438/667 |
| 7,169,649 B2 | * | 1/2007 | Rosa et al. ..................... | 438/118 |
| 2002/0025668 A1 | | 2/2002 | Ono | |
| 2005/0269681 A1 | * | 12/2005 | Asahi et al. ..................... | 257/686 |
| 2006/0121718 A1 | * | 6/2006 | Machida et al. .............. | 438/612 |
| 2006/0220173 A1 | * | 10/2006 | Gan et al. ....................... | 257/528 |
| 2008/0122087 A1 | | 5/2008 | Jobetto | |
| 2009/0050994 A1 | * | 2/2009 | Ishihara et al. ............... | 257/432 |
| 2010/0248428 A1 | * | 9/2010 | Yoshida et al. ............... | 438/118 |

FOREIGN PATENT DOCUMENTS

| | | |
|---|---|---|
| JP | 2002-076576 A | 3/2002 |
| JP | 2007-073921 A | 3/2007 |
| JP | 2007-242888 A | 9/2007 |
| JP | 2008-021792 A | 1/2008 |
| JP | 2008-135521 A | 6/2008 |

OTHER PUBLICATIONS

Japanese Patent Office, Office Action in Japanese Patent Application No. 2008-316076 (Apr. 19, 2011).

* cited by examiner

*Primary Examiner* — Thanh V Pham
*Assistant Examiner* — Andres Munoz
(74) *Attorney, Agent, or Firm* — Leydig, Voit & Mayer, Ltd.

(57) ABSTRACT

A wiring circuit layer 2 having a connecting conductor part 21 that can be connected to an electrode 31 of a semiconductor element 3 is formed on a metal support substrate 1 in a way such that the wiring circuit layer can be separated from the substrate 1, and that the connecting conductor part 21 is exposed on the upper face of the wiring circuit layer. The wiring circuit layer 2 is laminated on the element 3 while in a wafer state, and the connecting conductor part 21 and the electrode 31 are connected. Subsequently, the support substrate 1 is peeled from the wiring circuit layer 2, and the wafer is diced, whereby individual semiconductor devices are obtained.

12 Claims, 7 Drawing Sheets

(a)

(b)

(c)

(a)

(b)

(a)

(b)

(a)

(b)

(c)

(d)

(e)

(f)

MANUFACTURING METHOD OF TRANSFERRING A WIRING CIRCUIT LAYER ON A METAL SUPPORT SUBSTRATE TO A SEMICONDUCTOR ELEMENT

FIELD OF THE INVENTION

The present invention relates to a method of manufacturing a semiconductor device comprising a semiconductor element and a wiring circuit layer provided thereon.

BACKGROUND OF THE INVENTION

Semiconductor elements configured with various semiconductor materials (hereinafter also simply referred to as "elements"), such as IC using silicon semiconductor and organic EL elements using organic semiconductors, are usually produced by repeatedly foaming a matrix of multiple elements on a wafer substrate, then dicing the substrate into individual elements known as chips. In the description below, a wafer substrate having a semiconductor element formed thereon (state prior to dicing) is also referred to as "a semiconductor wafer".

In addition to a basic element structure, various wiring structures are fabricated in a semiconductor element while in the state of a wafer, in order to add sophisticated functions and for other purposes. Such wiring structures include, for example, a redistribution layer, conductive path (through hole via) that allow the element-side face and back face to communicate with each other electrically through a wafer substrate, and the like.

As disclosed in JP-A-2000-243754, for example, an aluminum electrode (an electrode pad included in an element as a semiconductor element structure) is formed, after which an insulating layer, a Cu-plated layer and the like are sequentially formed thereon, whereby a redistribution layer is formed.

After being provided with a wiring structure and divided into chips, any element serves as a semiconductor device with a connecting conductor that facilitates connection to, and mounting of, external conductors (external circuits and the like), compared with the original element, which simply has an electrode exposed.

For example, by providing a redistribution layer, aluminum electrodes of the element and conductors on an external circuit for mounting the element can easily be connected, even if they differ from each other in size or pitch.

Connection terminals can be formed on the back face of a wafer substrate by providing through hole vias that penetrate the wafer substrate in the direction of the substrate thickness.

Through investigations of such wiring structures to be added to a semiconductor element, the present inventors found that there was a room for further improvement in the two matters shown below, and identified them as problems to be solved by the present invention.

The first matter concerns manufacturing cost relating to a redistribution layer. The present inventors took note of the fact that processing for forming a redistribution layer directly on a semiconductor wafer is painstaking because of the necessity for building a redistribution layer on each semiconductor wafer, so that there is a room for reducing the manufacturing cost, although this had not been deemed a problem. If a redistribution layer formed is found to be of unacceptable quality, and even if the semiconductor wafer obtained is of acceptable quality as a whole, disposal of the semiconductor wafer as well is unavoidable, which increases the manufacturing cost, because the redistribution layer has already been formed monolithically on the semiconductor wafer.

The second matter concerns quality when a through hole via is formed in a semiconductor wafer, to which a separately formed interposer (a kind of wiring circuit substrate interposed for chip mounting) is connected. Because a through hole via is usually formed by filling a conductive paste in a through hole, the both ends thereof can protrude from the substrate faces of the semiconductor wafer, and the heights of the protrusions are variable. If an interposer is placed between an element with such protrusions and an external conductor while connecting both, the protrusion height variation causes a small gap in the interface between the interposer and the semiconductor wafer, which in turn can cause a connection failure in some elements, and reduce the reliability of the semiconductor device.

Problems to be solved by the present invention reside in improving the above-described two matters of which the present inventors took note. It is a first purpose of the present invention to provide a manufacturing method that enables a reduction of the manufacturing cost for redistribution layers conferred to semiconductor elements. A second purpose of the present invention is to provide a manufacturing method that enables production of a gapless semiconductor device even in the presence of variation in the heights of protrusions in the ends of a through hole via.

SUMMARY OF THE INVENTION

The present inventors extensively investigated to solve the above-described problems, and found that by forming a redistribution layer as a wiring circuit layer independent from a semiconductor wafer, and providing the wiring circuit layer with a support layer of metal in a way such that the support layer can be separated, the above-described two problems can be solved at one time. The inventors conducted further investigations based on this finding, and have developed the present invention.

Accordingly, the present invention has the following features.

(1) A method for manufacturing a semiconductor device having a structure wherein a semiconductor element and a wiring circuit layer are laminated, the method comprising the steps of:

forming a wiring circuit layer having a connecting conductor part that can be connected to an electrode of a semiconductor element, in a way such that, on a metal support substrate, the wiring circuit layer can be peeled from the substrate, and that the connecting conductor part is exposed on the upper surface of the wiring circuit layer, laminating the wiring circuit layer on the semiconductor element while in a wafer state to connect the connecting conductor part of the wiring circuit layer and the electrode of the semiconductor element, and separating the metal support substrate from the wiring circuit layer after the connection.

(2) The manufacturing method according to (1) above, wherein a release layer is present between the metal support substrate and the wiring circuit layer, whereby the wiring circuit layer can be peeled from the metal support substrate.

(3) The manufacturing method according to (2) above, wherein the release layer is a layer which is formed in a way such that the release layer can easily be peeled and separated from the wiring circuit layer, and is not easily detached from the metal support substrate, whereby the release layer can be removed from the wiring circuit layer together with the metal support substrate.

(4) The manufacturing method according to (2) above, wherein the release layer is made of polyimide.
(5) The manufacturing method according to (2) above, wherein the release layer is made of one material selected from among metals, metal oxides, and inorganic oxides.
(6) The manufacturing method according to (1) above, wherein the wiring circuit layer functions as a redistribution layer for the semiconductor element.
(7) The manufacturing method according to (1) above, wherein the wiring circuit layer has:
  an insulating layer,
  a conductive layer provided in the insulating layer,
  a connecting conductor part for connection to an electrode of a semiconductor element, on one surface of the insulating layer, and
  an externally-connecting conductor part for connection to an external conductor, on the other surface of the insulating layer, and
    wherein the connecting conductor part and the externally-connecting conductor part are connected to each other via the conductive layer provided in the insulating layer.
(8) The manufacturing method according to (7) above, wherein the insulating layer of the wiring circuit layer is a single layer consisting of the same polymer, or a lamination structure having a base insulating layer on the metal support substrate side and an adhesive layer for adhesion to the semiconductor element.
(9) The manufacturing method according to (1) above, wherein a wafer substrate, which is the substrate of the semiconductor element in a wafer state, is provided with a through hole via that penetrates the substrate in its thickness direction, and the electrode of the semiconductor element is communicable to the back face side of the wafer substrate through the through hole via, and
    wherein the wiring circuit layer is laminated on either one face of the wafer substrate, and an end of the through hole via and the connecting conductor part of the wiring circuit layer are connected.

DETAILED DESCRIPTION OF THE INVENTION

Hereinafter, the manufacturing method of the present invention is described by referring to specific examples.

As used herein, terms indicating upward or downward, such as "upper face" and "lower face", are only to explain the positional relationship of layers, and are not to be construed as limiting the actual vertical position of a wiring circuit layer or a semiconductor device.

Figure 1:
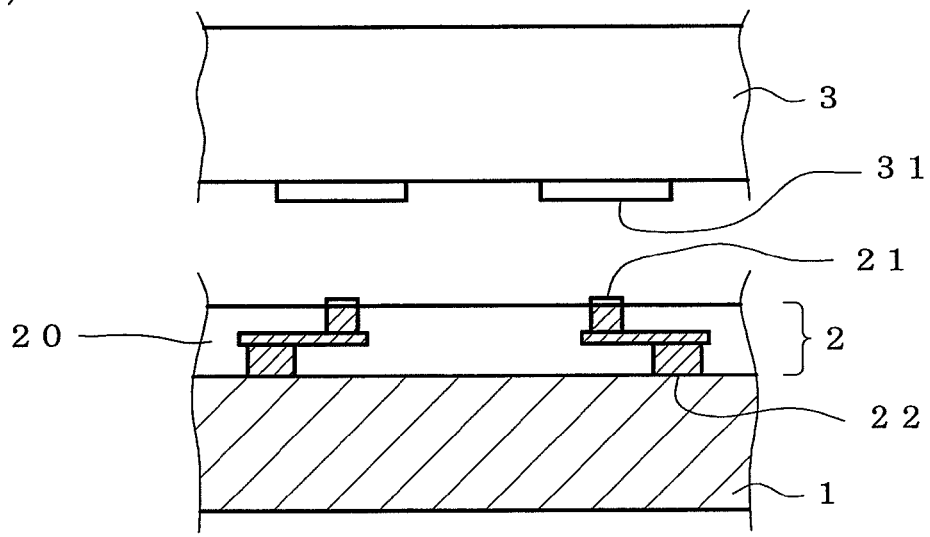
FIG. 1 shows schematic diagrams of how a wiring circuit layer is formed through each step to explain the manufacturing method of the present invention. Hatching is given as appropriate to distinguish different regions (the same applies to other drawings).
Figure 1:
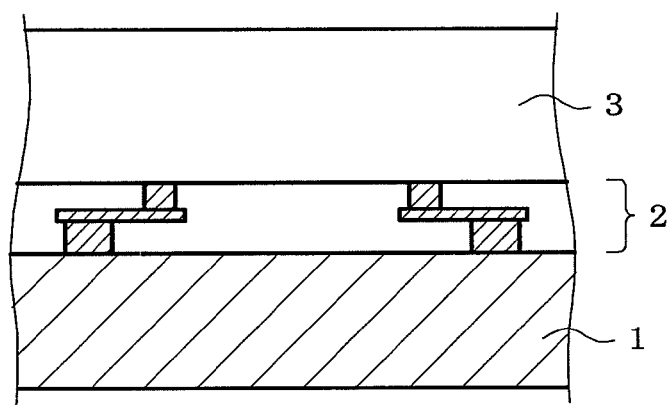
Figure 1:
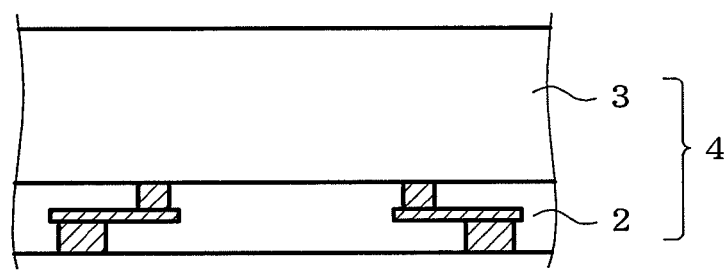

FIG. 1 schematically shows how a product is formed through respective steps in the manufacturing method of the present invention. The illustrated layer structures and connection patterns in the wiring circuit layers are simplified for the sake of explanation, and will be described in detail below.

Firstly, the manufacturing method comprises, as shown in FIG. 1(a), a step wherein a wiring circuit layer 2 is formed on a metal support substrate 1 to obtain a laminated structure in a way such that the wiring circuit layer can be peeled from the substrate 1. The wiring circuit layer 2 has a connecting conductor part 21 that can be connected to an electrode 31 of a semiconductor element 3 that is the subject of connection. The connecting conductor part 21 is exposed on the face opposite to the face on the metal support substrate 1 side in a way such that the connecting conductor part can be connected to the electrode 31 of the semiconductor element 3. In the actual manufacturing steps, the face on which the connecting conductor part 21 is exposed may be further covered with a release liner, which liner may be peeled before the connecting conductor part is connected to the semiconductor element.

By preparing wiring circuit layers through these independent steps, only those of acceptable quality can be connected to elements in a wafer state at low cost and in large amounts.

In FIG. 1(a), the connecting conductor part 21, the electrode 31 and the like are illustrated as if they are protruded more than in actual cases, so as to indicate their positions clearly. In FIG. 1, only one element is illustrated in a magnified view. In the actual settings, however, multiple elements are arranged in a matrix form on a substrate of wafer scale.

A gold stud bump, an underbump metal (UBM) and the like are formed in the electrodes of the element. The UBM is exemplified by Ni/Au layers formed by electroless plating (Ni is on the undercoat side; the same applies below, i.e., the undercoat side of the lamination is indicated first), Ti/Cu layers, Ti/W/Cu layers, and Ti/Ni/Cu layers formed by sputtering, and the like.

Next, the manufacturing method comprises a step in which the above-described wiring circuit layer 2 in lamination is laminated on the semiconductor element 3 in a wafer state, and the connecting conductor part 21 of the wiring circuit layer 2 and the electrode 31 of the element 3 are connected, as shown in FIG. 1(b).

In FIG. 1(b), the protrusions of each of the connecting conductor part 21 and the electrode 31 are omitted. In the actual step, the semiconductor element 3 and the wiring circuit layer 2 are brought into tight gapless adhesion by pressing.

Furthermore, the manufacturing method comprises a step in which the metal support substrate is separated by peeling from the wiring circuit layer, as shown in FIG. 1(c). This step yields a semiconductor device 4 wherein the semiconductor element 3 and the wiring circuit layer 2 are laminated.

In this stage, the semiconductor device is in a wafer form; semiconductor devices in the form of individual chips are obtained by dicing. The wiring circuit layer having the metal support substrate separated therefrom may be subjected to a processing such as providing a solder ball prior to dicing.

According to the manufacturing method of the present invention, the above-described first problem is solved as described below.

The manufacturing method of the present invention may be described as a method wherein a redistribution layer, previously prepared as a wiring circuit layer separately from a semiconductor element, is laminated on an element in a wafer state, such as a semiconductor wafer, to obtain a semiconductor device.

A large number of semiconductor devices of large areas that can include a large number of wafers can easily be produced on a roll-to-roll basis by separately producing wiring circuit layers, and therefore, the manufacturing cost is even lower than when a redistribution layer is formed directly on each semiconductor wafer.

Also, a metal support substrate provided for a wiring circuit layer in a way such that the circuit layer can be peeled confers adequate rigidity to the wiring circuit layer to increase the handleability until the wiring circuit layer is laminated on a semiconductor wafer, thus contributing to manufacturing cost reduction.

The manufacturing method of the present invention makes it possible to select wiring circuit layers of a non-defective only to connect the element in a wafer state, so that useless disposal of non-defective elements is avoided.

According to the manufacturing method of the present invention, moreover, the above-described second problem is solved as described below.

For example, when the connecting conductor part of a wiring circuit layer is connected to a face having a protruded terminal like an end of a through hole via, of the two faces of a semiconductor wafer, a metal support substrate presses the entire surface of the wiring circuit layer from behind with an appropriate rigidity. This pressing produces adequate compression just below the connecting conductor part of the wiring circuit layer, and the insulating layer around the connecting conductor part (particularly adhesive layer (described below)) fills the protrusion height differences in the terminal portion and comes in close contact with the wafer surface, with no gap produced in the interface between the wiring circuit layer and the semiconductor wafer.

As mentioned herein, a semiconductor device may be any one that permits laminating and connecting a wiring circuit layer; examples include conventionally known elements such as those of simple structure like single light-emitting element, arrays comprising an assembly thereof, organic semiconductor element, IC, processor with various operation circuits integrated therein, memory, photosensor, and image sensor, as well as multi-chip module, MEMS (micro-electro-mechanical systems; devices wherein machine components, sensors, actuators, electronic circuits and the like are integrated on a substrate) and the like.

The wafer substrate to form a semiconductor element thereon may be any substrate for semiconductor elements; examples include semiconductor crystal substrate such as of silicon, as well as insulating crystal substrate, glass substrate, substrate consisting of an organic compound, and the like. Of these substrates, the most versatile ones are silicon crystal substrates (silicon wafers).

As mentioned herein, "semiconductor element in a wafer state" include not only multiple semiconductor elements while in the form of a matrix on a wafer substrate (prior to dicing), to but also those prepared by checking multiple elements on a wafer substrate by quality inspection, once dicing the substrate into individual chips, thereafter rearranging only those non-defective chips on a sheet of the same shape as the wafer substrate. In the description below, "a semiconductor element in a wafer state" is also referred to as "a wafer-state element".

When laminated on, and connected to, a semiconductor element, a wiring circuit layer functions as a redistribution layer and intermediates connection to an external conductor.

Publicly known methods can be used to connect the electrode of the element and the connecting conductor part of the wiring circuit layer; examples include Au—Au bonding, Au stud bump-solder bonding, solder bump bonding, bonding using Ag paste, and bonding using ACF (anisotropic conductive film) or NCF (non-conductive film). To meet a demand for fine pitches, Au stud bump-solder bonding is suitably used. If a gap is produced between the device and the wiring circuit layer because of a bump height and the like, an underfill material or the like may be filled.

In the case of a structure wherein a through hole via that penetrates a wafer substrate in the thickness direction is present in the substrate, and an electrode of a semiconductor element is communicable to the back face side of the wafer substrate through the through hole via, a wiring circuit layer may be laminated on the back face side of the wafer substrate, and the connecting conductor part of the wiring circuit layer may be connected to the terminal of the through hole via. Also in this case, the wiring circuit layers may be used to connect the electrode of the element and the through hole via not on the back face side of the wafer substrate, but on the element side, and the wiring circuit layer may be laminated on both the back face side and the element side.

The arrangement patterns of individual wiring circuit layers contained in the wiring circuit layers prior to dicing may be any ones that correspond to the element array patterns in the wafer-like element and allow the connection of individual elements and wiring circuit layers.

The outer peripheral shape of the wiring circuit layer as a whole prior to dicing may be the same as the wafer substrate or a corresponding shape, a shape with even a larger area that can include a plurality of wafer substrates (simple sheets, bands rolled out from a roll, and the like), the same shape as the element assembly region in each wafer substrate or a corresponding shape, and the like.

Supplementary members to locate the wiring circuit layer prior to dicing and the wafer-like element and means to increase the handleability may be added as appropriate.

Although the inner structure and conductor connection structure of a wiring circuit layer are not particularly limited, a useful basic structure is such that, as shown in FIG. 1($a$), a connecting conductor part 21 for connection to an electrode of an element is present on one face of an insulating layer, an externally-connecting conductor part to an external conductor (a pad of an external circuit on which the semiconductor device is to be mounted, and the like) is present on the other face, and these conductor parts are connected to each other via the conductive layer provided in the insulating layer.

Figure 2:
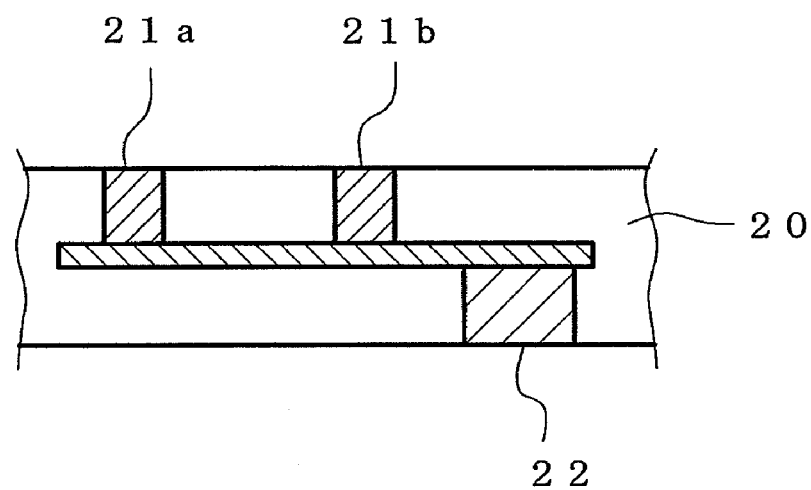
FIG. 2 shows various inner structure and connection structure of conductors in a wiring circuit layer formed by the present invention.
Figure 2:
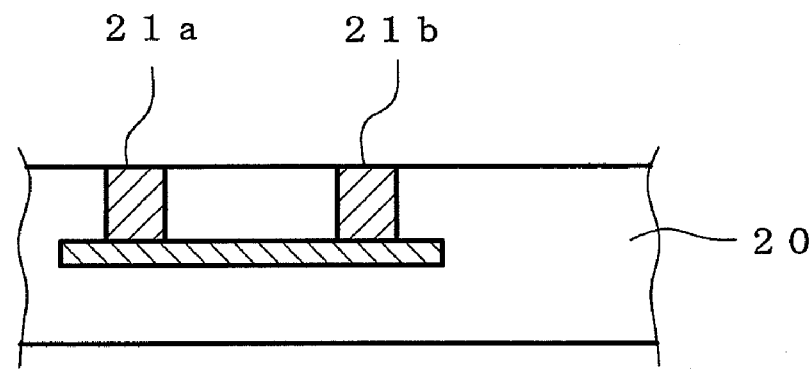

In addition to this typical example structure, other examples include a structure wherein particular connecting conductor parts 21$a$ and 21$b$ are connected to each other (FIG. 2($a$)), a structure wherein one connecting conductor part is connected to a plurality of conductor parts for external connection (not illustrated), a structure wherein particular connecting conductor parts 21$a$ and 21$b$ are connected to each other in the layer, and are not connected to an externally-connecting conductor part on the lower face of the wiring circuit layer (FIG. 2($b$)), and the like; the pattern of the connection structure may be freely varied and combined according to the intended use.

Figure 7:
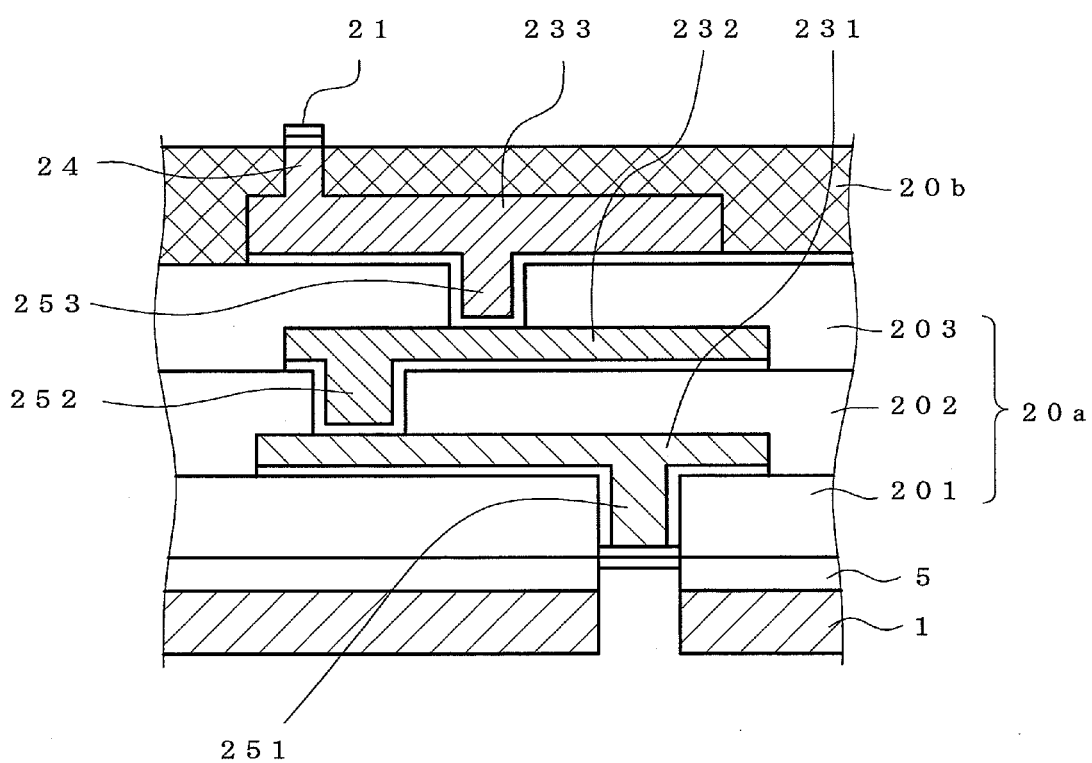
FIG. 7 shows an example structure wherein the conductive layer in the wiring circuit layer comprises multiple layers.
Numerical codes used in these drawings denote the following: 1; metal support substrate, 2; wiring circuit layer, 21; connecting conductor part, 22; externally-connecting conductor part, 5; semiconductor elements in a wafer state, 4; semiconductor device.

The wiring in the wiring circuit layer (a conductive layer extending laterally in the circuit layer) may be a single layer as shown in FIGS. 1 and 2, or a multiple layer as shown in FIG. 7.

Figure 3:
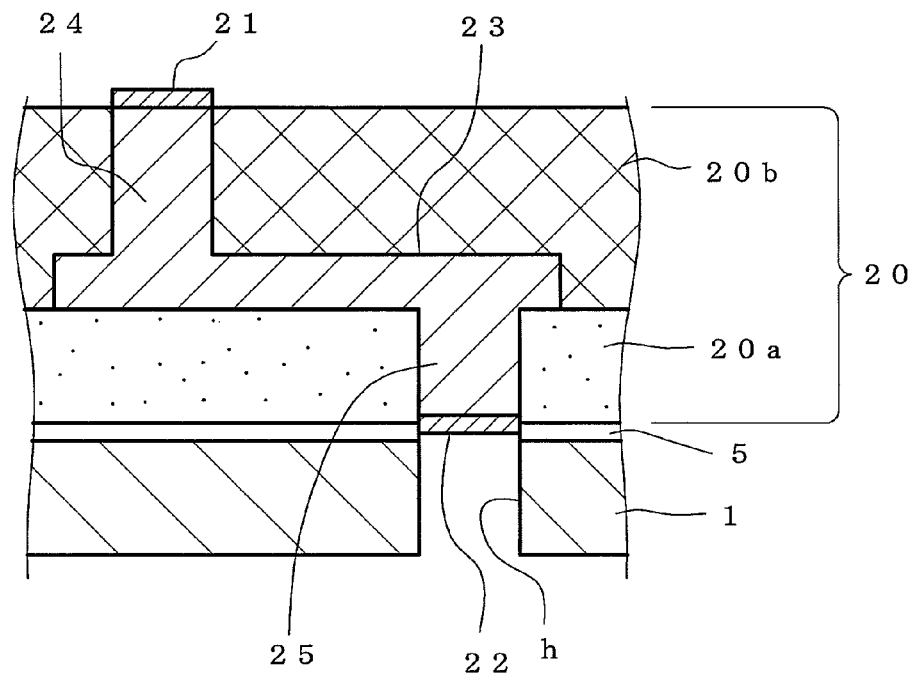
FIG. 3 shows schematic diagrams in greater detail of an example inner structure of a wiring circuit layer.
Figure 3:
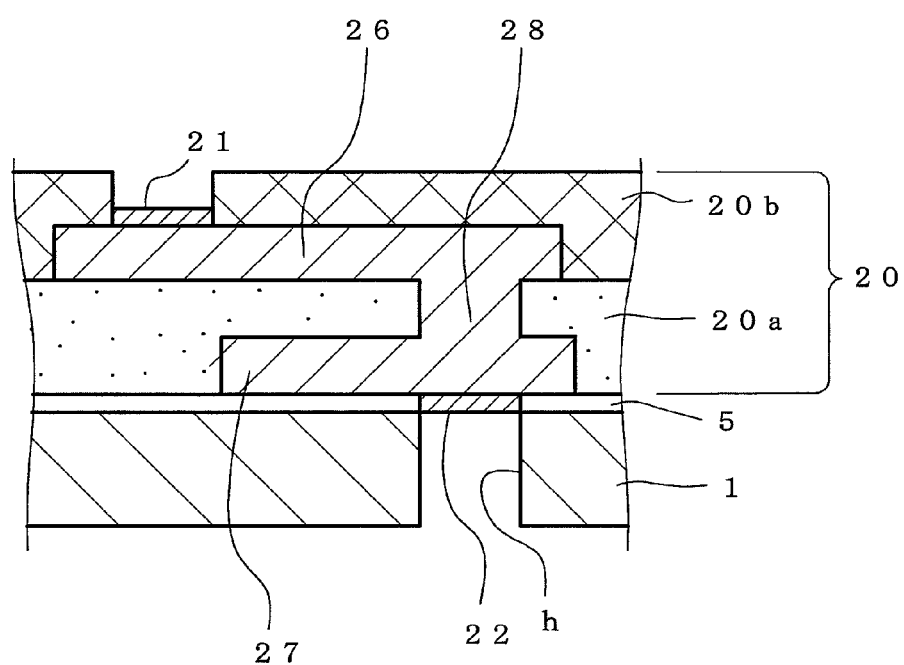

FIG. 3 is a schematic diagram showing further details of the inner structure of a wiring circuit layer.

In the embodiment shown in FIG. 3(a), a conductive layer 23 with a specified connecting pattern is present an insulating layer 20, wherein the tip of a conductive path (metal column) 24 extending from the conductive layer 23 to the element side constitutes a connecting conductor part 21, while the tip of a conductive path (metal column) 25 extending in reverse from the conductive path 23 to the metal support substrate side constitutes an externally-connecting conductor part 22. In this embodiment, a metal film for more preferred electrical connection and increased corrosion resistance is formed on the tip of each conductive layer.

In the embodiment illustrated in FIG. 3(b), a conductive layer 26 on the element side and a conductive layer 27 on the metal support substrate side are provided in an insulating layer 20 while in a state vertically separated to two stages. The conductive layer 26 on the element side is embedded in the insulating layer (in the illustrated case, covered with adhesive layer 20b). In the embodiment illustrated, the conductive layer 27 on the metal support substrate side is provided abutting a release layer 5. As such, the conductive layers 26 and 27 are connected to each other by a conductive path 28 provided at a specified position therebetween. On the upper face of the adhesive layer 20b, an opening is present at a specified position, into which the conductive layer 26 is exposed; the exposed portion in the opening constitutes a connecting conductor part 21 for connection to the element. In the embodiment illustrated, meanwhile, the lower face of the conductive layer 27 on the metal support substrate side is entirely exposed to the lower face of the insulating layer; an opening (through hole h) is formed at a specified position in the lower face of a metal support substrate 1, the release layer 5 has been removed to expose the lower face of the conductive layer 27, and the exposed portion in the opening constitutes an externally-connecting conductor part 22. The exposed portion in each opening may be one simply having the conductive layer exposed; in the embodiment illustrated, however, a metal film for more preferred electrical connection and increased corrosion resistance is present on the surface of each exposed portion.

The above-described metal film is preferably formed by plating; useful materials for the metal film include single metals such as copper, gold, silver, platinum, lead, tin, nickel, cobalt, indium, rhodium, chromium, tungsten, and ruthenium, and alloys consisting of two or more thereof and the like. Preferred materials include gold, tin, nickel and the like; preferred modes of the metal film include a double-layer structure with an underlayer of Ni and a surface layer of Au and the like.

As shown in FIGS. 3(a) and (b), an opening (through hole h) is provided for the metal support substrate at a position corresponding to the externally-connecting conductor part 22, whereby the tip of the externally-connecting conductor part 22 is allowed to protrude from the lower face of the insulating layer 20a.

The insulating layer 20 of the wiring circuit layer may be a single layer consisting of the same polymer, and may also be a lamination structure having a base insulating layer 20a on the metal support substrate side and an adhesive layer 20b for adhesion to an element, as shown in FIGS. 3(a) and (b). Provided that the electrode of the element and the connecting conductor part of the wiring circuit substrate become unified with sufficient mechanical strength upon bonding thereof, the adhesive layer may be omitted, and the insulating layer 20 may be a publicly known insulating layer with no adhesive quality.

Examples of useful materials for base insulating layers include, but are not limited to, publicly known synthetic resins such as polyimide resin, acrylic resin, polyether nitrile resin, polyether sulfone resin, epoxy resin, polyethylene terephthalate resin, polyethylene naphthalate resin, and polyvinyl chloride resin, composites of these resins with synthetic fiber cloth, glass cloth, nonwoven glass fabric, microparticles such as of $TiO_2$, $SiO_2$, $ZrO_2$, minerals, and clay, and the like. In particular, preference is given to polyimide resin, epoxy resin, and glass cloth-epoxy resin because a thinner flexible insulating layer with higher mechanical strength and better electrical characteristics (insulating characteristic and the like) is obtained after the metal support layer is peeled and separated.

The thickness of the base insulating layer is preferably 3 to 50 μm.

Preferable materials for the adhesive layer include, but are not limited to, thermoplastic resins such as polysulfone, polyether sulfone, polyhydantoin, polyether imide, polyester, polyimide siloxane, and siloxane-modified polyamide imide, epoxy resins, acrylic resins, silicone resins, polyimide resins and the like; these may be used in blends.

Useful epoxy resins include, but are not limited to, epoxy resins blended with a thermoplastic resin, rubber, elastomer and the like, silica hybrids, nano-particle-dispersed epoxy resins and the like.

Examples of useful acrylic resins include, but are not limited to, epoxy acrylate, urethane acrylate, silicone acrylate and the like.

The thickness of the adhesive layer is preferably 1 to 100 μm.

As a formation method of a wiring circuit layer on a metal support substrate, conventionally known methods for producing circuit substrates or interposers, such as the semi-additive method and the subtractive method, can be employed.

By forming a wiring circuit layer on a metal support substrate, the dimensional stability during the manufacturing is increased, and the handleability of thin wiring circuit layers is improved.

Figure 4:
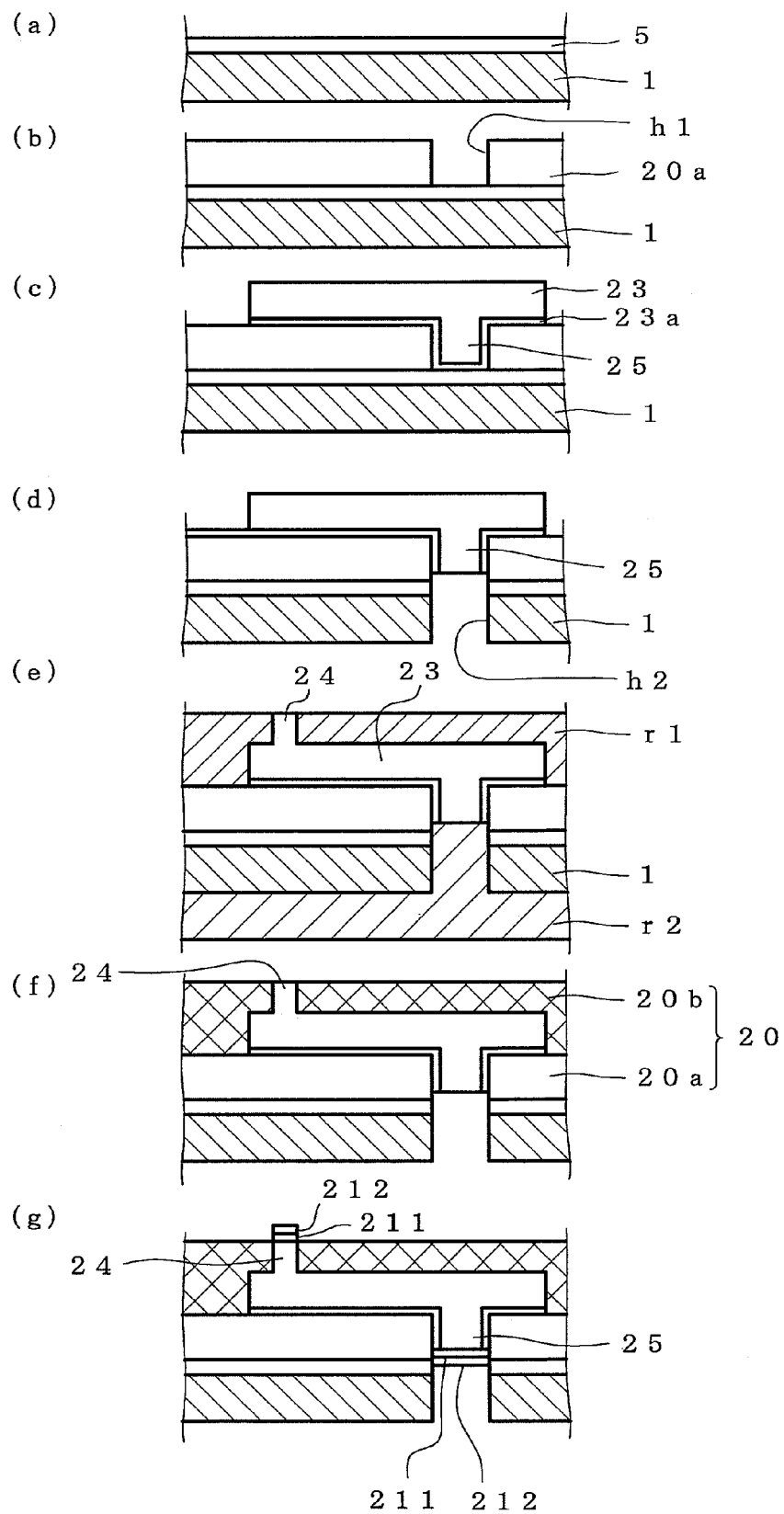
FIG. 4 shows the procedures of processing in an embodiment of the present invention.
Figure 5:
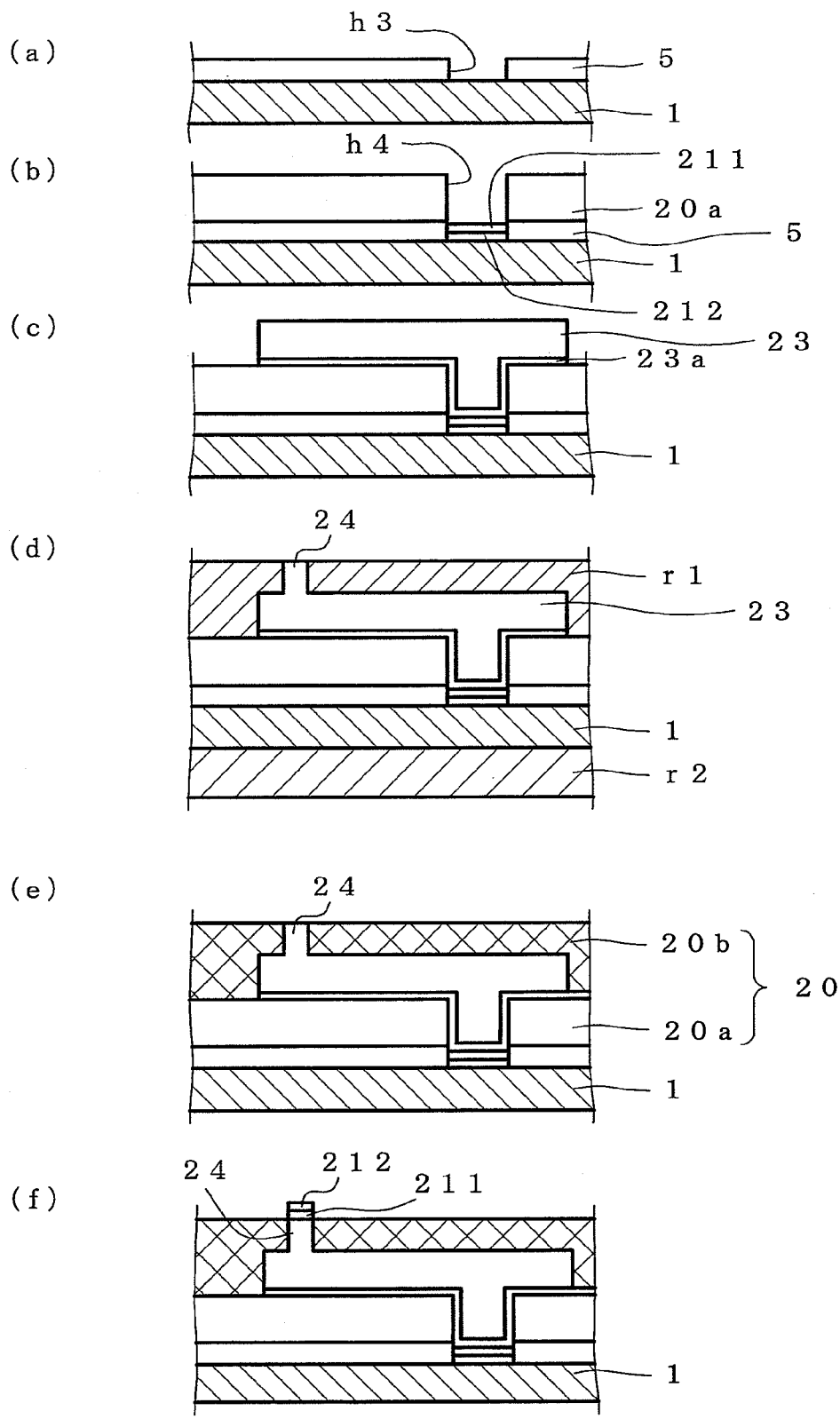
FIG. 5 shows the procedures of processing in another embodiment of the present invention.
Figure 6:
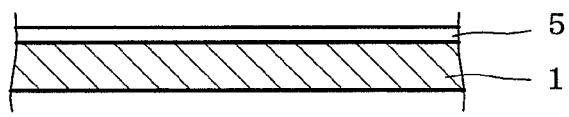
FIG. 6 shows the procedures of processing in still another embodiment of the present invention.
Figure 6:
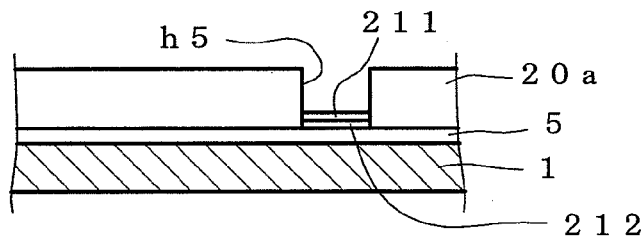
Figure 6:
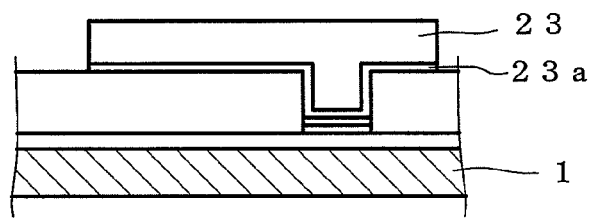
Figure 6:
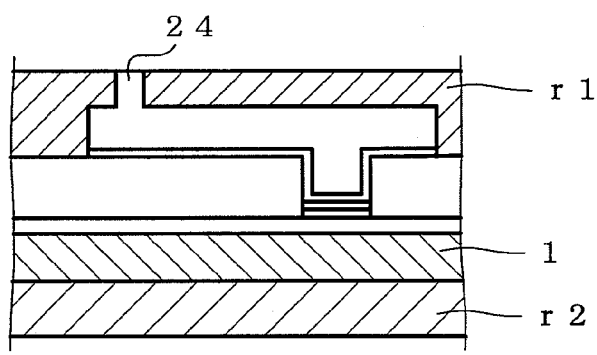
Figure 6:
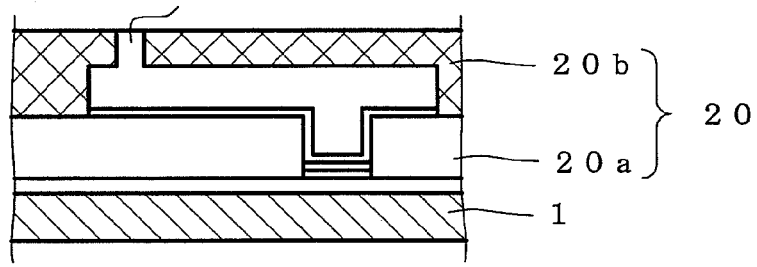
Figure 6:
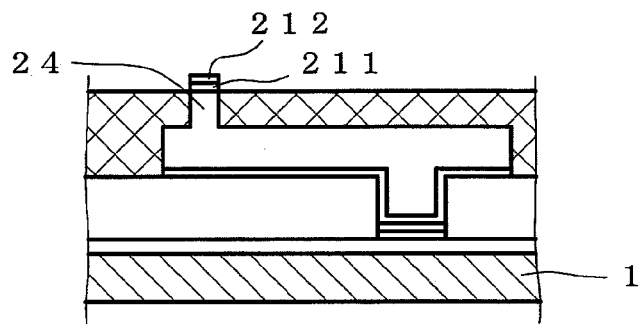

When a conductive layer and a conductive path are formed in a wiring circuit layer by the semi-additive method, it is preferable that, as shown in FIG. 4, a seed film 23a (metal thin film) for allowing a metal material to deposit well on the conductive layer 23 and the wall surface of the part to constitute the conductive path 25 be formed by sputtering in advance. Examples of useful materials for such a seed film include single metals such as copper, gold, silver, platinum, lead, tin, nickel, cobalt, indium, rhodium, chromium, tungsten, and ruthenium, alloys consisting of two kinds or more thereof and the like.

Examples of materials for the conductive layer and conductive path shown in FIG. 3 include single metals selected from among copper, gold, silver, platinum, lead, tin, nickel, cobalt, indium, rhodium, chromium, tungsten, ruthenium and the like, and alloys comprising one or more thereof (e.g., solders, nickel-tin, gold-cobalt, and the like). In particular, metals that permit electroplating or electroless plating are preferably used. Copper is preferred because of its excellency in the ease of forming a conductive layer circuit pattern and electrical characteristics.

The thickness of the conductive layer 23 may be chosen as appropriate in, but is not limited to, the range of 1 to 50 μm. The conductive paths 24 and 25 preferably have a cylindrical shape, the diameter thereof being 5 to 500 μm, preferably 5 to 300 μm.

Preferred materials for the metal support substrate include, but are not limited to, copper, copper alloys based primarily on copper, nickel, nickel alloys based primarily on nickel, alloys based primarily on nickel and iron, stainless steel, and the like.

To minimize the difference in the coefficient of linear expansion from the semiconductor wafer, an alloy based primarily on nickel and iron (e.g., 42 alloy) is preferably used.

The thickness of the metal support substrate is variable depending on the rigidity of the material, and is preferably about 10 μm to 200 μm, more preferably about 20 μm to 80 μm.

If the thickness of the metal support substrate is less than 10 μm, creases and wrinkles are likely to occur in the metal support substrate, which in turn reduces the handleability in the roll process. If the thickness of the metal support substrate exceeds 200 μm, the winding diameter increases due to the rigidity thereof, which in turn hampers the handling in the roll process and also interfere with the processing by etching.

To facilitate the smoother peeling of the metal support substrate and he wiring circuit layer, a structure is preferable wherein a release layer is present therebetween. It is preferable that the release layer be formed in a way such that the release layer is easily detached from the wiring circuit layer and is unlikely to detached from the metal support substrate, and that the release layer is removable, together with the metal support substrate, from the wiring circuit layer.

Useful materials for the release layer include organic substances (silicone resin, polyimide and the like) and inorganic substances (metals, metal oxides, inorganic oxides and the like). The inorganic substances are exemplified by Ag, Ti, W, Ni, $SiO_2$ and the like.

Considering the steps of producing a wiring circuit layer and the high heat conditions during connecting the wiring circuit layer to a semiconductor wafer, greater preference is given to polyimide and the aforementioned inorganic substances because silicone resin can deteriorate.

When the release layer is formed as a polyimide layer, the thickness thereof is preferably 0.1 to 10 μm, with further preference given to 0.1 to 5 μm in preventing the entire wiring circuit layer from bowing.

When the release layer is formed as a layer consisting of one of the aforementioned inorganic substances, the thickness thereof is preferably 1 to 100 nm, with further preference given to 1 to 50 nm in preventing the entire wiring circuit layer from bowing.

When the release layer is a polyimide layer, useful methods of forming the layer include a method wherein a solution is coated, a method wherein the layer is deposited by electrodeposition or chemical vapor deposition (CVD), a method wherein a separately formed polyimide film is laminated, and the like. When the release layer is a layer consisting of an inorganic substance such as a metal, metal oxide, or inorganic oxide, useful methods of forming the layer include electroplating, vacuum evaporation, sputtering and the like.

EXAMPLES

The manufacturing method of the present invention is hereinafter described more specifically and in further detail with reference to actual production examples. For all the wiring circuit layers in FIGS. 4 to 7, which are referred to in the following explanation, only one connecting conductor part and one externally-connecting conductor part corresponding thereto on the back face of the latter are magnified.

Example 1

A release layer consisting of polyimide was formed on a metal support substrate consisting of 42 alloy, a wiring to circuit layer was formed thereon, and then, this was bonded to a semiconductor wafer. Noble metal plating for a contact point on an end face of an externally-connecting conductor part was performed; an opening was made in the metal support substrate from the lower side to expose an end face of the externally-connecting conductor part, and the end face was plated.

[Formation of Release Layer]

As shown in FIG. 4(a), using a 42 alloy foil having a thickness of 50 μm as a metal support substrate 1, a polyamic acid solution (prepared by a reaction of pyromellitic dianhydride and 2,2'-dimethyl-4,4'-diaminobiphenyl) was applied thereon), and dried and imidated by heating, whereby a polyimide release layer 5 having a thickness of 2 μm was formed on the entire surface.

[Formation of Base Insulating Layer]

As shown in FIG. 4(b), a polyimide layer (base insulating layer) 20a was formed using a light-sensitive polyamic acid (prepared by a reaction of 3,4',3,4'-biphenyltetracarboxylic acid dianhydride, 4,4'-diaminodiphenyl ether, and para-phenylenediamine, and containing a photosensitizer). An opening h1 was made at the position where an externally-connecting conductor part was to be formed. The release layer was exposed on the bottom of the opening. The base insulating layer was 5 μm in thickness, and the opening was circular in shape and 100 μm in diameter.

[Formation of Seed Film, Lower Conductive Path, and Conductive Layer]

As shown in FIG. 4(c), sputtering with chromium and then with copper was performed to form a seed film 23a (chromium layer thickness 20 nm, copper layer thickness 100 nm), and a conductive layer 23 with a specified wiring pattern and a conductive path 25 were formed by electrolytic copper plating. Subsequently, the portion of the seed film where the conductive layer 23 was absent was removed. Since the copper layer of the seed film became unified with the copper of the conductive path and conductive layer, the seed film 23a is illustrated like a single layer consisting of chromium in FIG. 4(c). The same applies to FIGS. 5 to 7.

[Formation of Opening in Metal Support Substrate]

As shown in FIG. 4(d), an opening h2 having a diameter of 300 μm was formed from the lower surface the metal support substrate 1 at a position corresponding to the conductive path 25, using an aqueous solution of ferrous chloride to form the opening h2 to expose a release layer (polyimide layer) 5 in the opening. Furthermore, the release layer 5 was removed by etching with an alkaline treatment liquid to expose the seed film (chromium layer) 23a, and the chromium layer was etched using a mixed aqueous solution of potassium ferricyanide and sodium hydroxide to expose the copper layer.

[Formation of Upper Conductive Path]

As shown in FIG. 4(e), the upper face of the conductive layer 23 was covered with a plating resist r1 (except for the portion where a conductive path was to be formed), the lower face of the metal support substrate 1 and the opening h2 were entirely covered with a resist r2, and a conductive path 24 having a diameter of 80 μm and a height of 15 μm was formed by electrolytic copper plating.

[Formation of Adhesive Layer]

As shown in FIG. 4(f), the plating resists r1 and r2 were removed, an adhesive layer 20b mainly comprising epoxy and polyimide was formed in a way such that the exposed conductive layer 23 and conductive path 24 were embedded, and the adhesive layer was etched using an alkaline solution in a way such that the upper end face of the conductive path 24, as a terminal portion, was exposed on the upper face of the adhesive layer.

[Formation of Metal Film in Terminal Part]

As shown in FIG. 4(g), a nickel film (2 μm in thickness) and a gold film (0.5 μm in thickness) were sequentially formed by electroplating on the upper face of the conductive path 24 and the bottom face in the opening of the metal support substrate (lower end face of the conductive path 25).

[Connection to Semiconductor Wafer]

The wiring circuit layer thus obtained (the metal support substrate attached peelably) was connected to a semiconductor wafer by the following procedure.

The semiconductor wafer had 240 elements therein, each element had 240 circular electrode pads 80 μm in diameter, with a gold stud bump 60 μm in diameter formed on each pad.

The wiring circuit layers thus obtained was aligned and bonded in a vacuum of 3 Pa at a temperature of 300° C. under a pressure of 1.5 g/bump using an aligner and bonding apparatus (manufactured by EV Group), after which the adhesive layer was cured at 180° C. for 2 hours. Subsequently, the metal support substrate was peeled at the interface between the release layer 5 and the base insulating layer 20a, and the release layer 5 and the metal support substrate were removed, whereby a semiconductor device was obtained.

Example 2

In this example, noble metal plating for a contact point on an end face of an externally-connecting conductor part was performed. No opening was made in the metal support substrate; an opening was made at a specified position of a release layer, and a noble metal layer for the contact point was formed, after which a conductive path was formed thereon.

[Formation of Release Layer]

As shown in FIG. 5(a), using a metal support substrate 1 which was the same 42 alloy foil, a release layer 5 consisting of polyimide, and having a thickness of 2 μm, was formed thereon as in Example 1, using the same light-sensitive polyamic acid solution as in Example 1. An opening h3 was present in a specified position where an externally-connecting conductor part of the release layer was to be formed. The opening was circular in shape and 100 μm in diameter.

[Formation of Base Insulating Layer and Formation of Metal Film for Contact Point]

As shown in FIG. 5(b), a polyimide layer having an opening h4 corresponding to the opening h3 (base insulating layer 20a) was formed using the same light-sensitive polyamic acid as in Example 1. The base insulating layer 20a was 5 μm in thickness, and the opening was circular in shape and 100 μm in diameter.

Subsequently, a gold layer 212 and a nickel layer 211 were sequentially formed by electroplating on the surface of the metal support substrate exposed in the openings h4 and h3.

[Formation of Seed Film, Lower Conductive Path, and Conductive Layer]

As shown in FIG. 5(c), sputtering with chromium and then with copper was performed to form a seed film 23a (chromium layer thickness 20 nm, copper layer thickness 100 nm), and a conductive layer 23 with a specified wiring pattern and a conductive path 25 were formed by electrolytic copper plating. Subsequently, the portion of the seed film where the conductive layer 23 was absent was removed.

[Formation of Upper Conductive Path]

As shown in FIG. 5(d), the upper face of the conductive layer 23 was covered with a plating resist r1 (except for the portion where a conductive path was to be formed), and the lower surface of the metal support substrate 1 was entirely covered with a resist r2. A conductive path 24 having a diameter of 80 μm and a height of 15 μm was formed by electrolytic copper plating.

[Formation of Adhesive Layer]

As shown in FIG. 5(e), and using the same materials and procedures as in Example 1 above, the plating resists r1 and r2 were removed, an adhesive layer 20b was formed in a way such that the exposed conductive layer 23 and conductive path 24 were embedded, and the adhesive layer was etched in a way such that the upper end face of the conductive path 24, as a terminal portion, was exposed on the upper face of the adhesive layer.

[Formation of Metal Film on End Face of Connecting Conductor Part]

As shown in FIG. 5(f), a nickel film (2 μm in thickness) and a gold film (0.5 μm in thickness) were sequentially formed on the upper end face of the conductive path 24 by electroplating.

Here in Example 2, as shown in FIG. 5(a), an opening was first formed in a release layer; therefore, there was no need to form an opening in the metal support substrate for nickel plating and gold plating for the terminal, as shown in FIG. 4(d), compared to Example 1.

[Connection to Semiconductor Wafer]

The wiring circuit layer thus obtained (the metal support substrate attached peelably) was connected to the semiconductor wafer using the same procedures as Example 1, and the release layer and metal support substrate were removed, whereby a semiconductor device was obtained.

Example 3

In this example, a metal was used as the material for a release layer.

[Formation of Release Layer]

As shown in FIG. 6(a), a release layer 5 (25 nm in thickness) consisting of Ag was formed by vacuum evaporation on a metal support substrate 1 which was the same 42 alloy foil as in Example 1.

[Formation of Base Insulating Layer and Formation of Metal Film for Contact Point]

As shown in FIG. 6(b), a polyimide layer having an opening h5 (base insulating layer 20a) was formed using the same light-sensitive polyamic acid as in Example 1. The base insulating layer 20a was 5 μm in thickness, the opening being circular in shape and 100 μm in diameter.

A gold layer 212 and a nickel layer 211 were sequentially formed on the Ag surface exposed in the opening by electroplating.

[Formation of Seed Film, Lower Conductive Path, and Conductive Layer]

As shown in FIG. 6(c), sputtering with chromium and then with copper was performed to form a seed film 23a (chromium layer thickness 20 nm, copper layer thickness 100 nm); a conductive layer 23 with a specified wiring pattern and a conductive path 25 were formed by electrolytic copper plating. Subsequently, the portion of the seed film where the conductive layer 23 was absent was removed.

As shown in FIG. 6(d), the upper face of the conductive layer 23 was covered with a plating resist r1 (except for the portion where a conductive path is to be formed), and the lower face of the metal support substrate 1 was entirely covered with a resist r2. A conductive path 24 having a diameter of 80 μm and a height of 15 μm was formed by electrolytic copper plating.

[Formation of Adhesive Layer]

As shown in FIG. 6(e), and using the same materials and procedures as in Example 1 above, the plating resists r1 and r2 were removed, an adhesive layer 20b was formed in a way such that the exposed conductive layer 23 and conductive path 24 were embedded, and the adhesive layer was etched in a way such that the upper end face of the conductive path 24, as a terminal portion, was exposed on the upper face of the adhesive layer.
[Formation of Metal Film on End Face of Connecting Conductor Part]

As shown in FIG. 6(f), a nickel film 211 (2 µm in thickness) and a gold film 212 (0.5 µm in thickness) were sequentially formed on the upper end face of the conductive path 24 by electroplating.

Here in Example 3, as shown in FIG. 6(b), gold plating and nickel plating were possible by supplying electricity through the release layer (Ag layer); therefore, there was no need to form an opening in the metal support substrate for nickel plating and gold plating of the terminal, as shown in FIG. 4(d), compared to Example 1.
[Connection to Semiconductor Wafer]

The wiring circuit layer thus obtained (the metal support substrate attached peelably) was connected to a semiconductor wafer using the same procedures as Example 1, and the release layer and the metal support substrate were removed, whereby a semiconductor device was obtained.

Example 4

In this example, an inorganic oxide ($SiO_2$) was used as the material for a release layer.
[Formation of Release Layer]

As shown in FIG. 4(a), a release layer 5 consisting of $SiO_2$ (7 nm in thickness) was formed by sputtering on a metal support substrate 1 which was the same 42 alloy foil as in Example 1.

The procedures, materials and the like used in the subsequent steps of [Formation of base insulating layer and formation of metal film for contact point], [Formation of seed film, lower conductive path, and conductive layer], [Formation of adhesive layer], [Formation of metal film on end face of connecting conductor part], and [Connection to semiconductor wafer] were exactly the same as in Example 1.

In this Example, in the step shown in FIG. 4(d), the $SiO_2$ film which was the release layer was removed at the same time as etching of the metal support substrate 1 to make an opening from the lower face side of the metal support substrate, because the film was very thin.

Example 5

In this Example, as shown in FIG. 7, multiple conductive layers were formed as the conductive layer in a wiring circuit layer.

The embodiment shown in FIG. 7 represents the same structure obtained in Example 1 above, except that base insulating layers and conductive layers are repeatedly laminated.

In this Example, processing was performed in the same manner as Example 1 for the processes from [Formation of release layer on metal support substrate] in FIG. 4(a) to [Formation of opening in metal support substrate] in FIG. 4(d). Through this processing, as shown in FIG. 7, a metal support substrate 1, a release layer 5, a first base insulating layer 201, a first conductive path 251, and a first conductive layer 231 were formed. A seed film was also prepared in the same manner as Example 1.

Next, in this example, the same processing shown in FIG. 4(b) was performed again, instead of proceeding to the step in FIG. 4(e), to embed a first conductive layer 231 in a second base insulating layer 202, and to make an opening at a specified position therein. As shown in FIG. 4(c), a second conductive path 252 and a second conductive layer 232 were formed. The same processing described above was performed again to form a third base insulating layer 203, a third conductive path 253, and a third conductive layer 233.

Subsequently, the steps of FIGS. 4(e) to (f) were performed to form an upper conductive path 24 and an adhesive layer 20b, and to form a metal film on a terminal portion 21.

Through the processing steps described above, the wiring circuit layer illustrated in FIG. 7 was obtained.

Example 6

In this example, it was confirmed that a wiring circuit layer could be gaplessly bonded to a semiconductor wafer having a through hole via with the terminal protruding from a wafer surface.
[Semiconductor Wafer]

A silicon semiconductor wafer 400 µm in thickness and 6 inches in diameter was prepared and through holes 100 µm in diameter were formed therein. The through holes were filled with a copper paste by printing in a way such that the terminal portions were elevated by about 5 µm, and the wafer was burnt to form a protruded terminal portion.
[Wiring Circuit Layer]

A wiring circuit layer having a peelable metal support substrate was obtained in the same manner as Example 1.
[Connection]

The wiring circuit layer and the semiconductor wafer were bonded together by pressing under the same conditions as Example 1 to yield a semiconductor device.

Absolutely no gap was present between the semiconductor wafer and wiring circuit layer thus obtained, and the connection between the electrodes of all elements and the connecting conductor part of the wiring circuit layer was good.

INDUSTRIAL APPLICABILITY

According to the manufacturing method of the present invention, a redistribution layer can be provided for a semiconductor element at lower cost, and disposal of semiconductor elements of acceptable quality because of unacceptable quality of the redistribution layer is avoidable. The manufacturing method of the present invention also enables production of a gap-free semiconductor device even if an end of a through hole via is protruded.

This application is based on a patent application No. 2008-316076 filed in Japan, the contents of which are incorporated in full herein by this reference.

The invention claimed is:

1. A method for manufacturing a semiconductor device having a structure wherein a semiconductor element and a wiring circuit layer are laminated,
the wiring circuit layer comprising
an insulating layer,
a conductive layer provided in the insulating layer,
a connecting conductor part on one face of the insulating layer, wherein the connecting conductor part is connected to an electrode of the semiconductor element, and
an externally-connecting conductor part on the other face of the insulating layer, wherein the externally-connecting conductor part is for connecting to an external conductor, wherein
the connecting conductor part and the externally-connecting conductor part are connected to each other via the conductive layer,
the insulating layer comprises a lamination structure having a base insulating layer on a metal support substrate side and an insulating layer on a semiconductor element side, and
a conductive path extends from the conductive layer to the metal support substrate side and the tip of the conductive path constitutes the externally-connecting conductor part, the method comprising the steps of:
forming the wiring circuit layer having the connecting conductor part that is connected to the electrode of the semiconductor element, in a way such that, on the metal support substrate comprising a release layer, the wiring circuit layer is peeled from the metal support substrate, and the connecting conductor part is exposed on the upper surface of the wiring circuit layer,
laminating the wiring circuit layer on the semiconductor element while in a wafer state to connect the connecting conductor part of the wiring circuit layer and the electrode of the semiconductor element, and
separating the metal support substrate from the wiring circuit layer after the connection,
wherein
prior to the forming step of the wiring circuit layer, an opening in the release layer is formed wherein the location of the opening corresponds to the location of the externally-connecting conductor part of the wiring circuit layer,
in the forming step of the wiring circuit layer, the base insulating layer having an opening is formed, wherein the location of the opening corresponds to the location of the opening of the release layer,
on the surface of the metal support substrate exposed in the coincident openings, a metal film for preferred electrical connection and increased corrosion resistance is formed, and then,
filling the coincident openings with a metal material to form the conductive path, which forms a structure of the metal film covering the surface of the externally-connecting conductor part of the wiring circuit layer.

2. The manufacturing method according to claim 1, wherein the release layer is made of polyimide, and wherein the metal support substrate and the release layer are peeled together from the wiring circuit layer.

3. The manufacturing method according to claim 1, wherein the release layer is made of one material selected from the group consisting of metals, metal oxides, and inorganic oxides, and wherein the metal support substrate and the release layer are peeled together from the wiring circuit layer.

4. The manufacturing method according to claim 1, wherein the wiring circuit layer is a redistribution layer for the semiconductor element.

5. The manufacturing method according to claim 1, wherein the insulating layer on the semiconductor element side is an adhesive layer.

6. The manufacturing method according to claim 1, wherein a wafer substrate, which is the substrate of the semiconductor element in a wafer state, is provided with a through hole via that penetrates the substrate in its thickness direction, and the electrode of the semiconductor element is communicable to a back face side of the wafer substrate through the through hole via, and wherein the wiring circuit layer is laminated on either the back face or a front face of the wafer substrate, and an end of the through hole via and the connecting conductor part of the wiring circuit layer are connected.

7. The manufacturing method according to claim 1, wherein
in the forming step of the metal film, a gold layer and a nickel layer are formed sequentially by electroplating on the surface of the metal support substrate exposed in the coincident openings, which forms the metal film having a double-layer structure with an underlayer of the nickel layer and a surface layer of the gold layer on the surface of the externally-connecting conductor part of the wiring circuit layer.

8. A method for manufacturing a semiconductor device having a structure wherein a semiconductor element and a wiring circuit layer are laminated,
the wiring circuit layer comprising
an insulating layer,
a conductive layer provided in the insulating layer,
a connecting conductor part on one face of the insulating layer, wherein the connecting conductor part is connected to an electrode of the semiconductor element, and
an externally-connecting conductor part on the other face of the insulating layer, wherein the externally-connecting conductor part is for connection to an external conductor,
wherein
the connecting conductor part and the externally-connecting conductor part are connected to each other via the conductive layer,
the insulating layer comprises a lamination structure having a base insulating layer on a metal support substrate side and an insulating layer on the semiconductor element side,
a conductive path extends from the conductive layer to the metal support substrate side, and the tip of the conductive path constitutes the externally-connecting conductor part, the method comprising the steps of:
forming the wiring circuit layer having the connecting conductor part that is connected to the electrode of the semiconductor element, in a way such that, on the metal support substrate comprising a release layer, the wiring circuit layer is peeled from the metal support substrate, and the connecting conductor part is exposed on the upper surface of the wiring circuit layer, wherein the release layer is made of one material selected from the group consisting of metals and metal oxides, whereby the metal support substrate and the release layer are peeled together from the wiring circuit layer,
laminating the wiring circuit layer on the semiconductor element while in a wafer state to connect the connecting conductor part of the wiring circuit layer and the electrode of the semiconductor element, and
separating the metal support substrate from the wiring circuit layer after the connection,
wherein
in the forming step of the wiring circuit layer, the base insulating layer having an opening is formed wherein the location of the opening corresponds to the location of the externally-connecting conductor part,
on the surface of the release layer exposed in the opening, a metal film for preferred electrical connection and increased corrosion resistance is formed, and then,
filling the opening with a metal material to form the conductive path, which forms a structure of the metal film covering the surface of the externally-connecting conductor part of the wiring circuit layer.

9. The manufacturing method according to claim 8, wherein the wiring circuit layer is a redistribution layer for the semiconductor element.

10. The manufacturing method according to claim 8, wherein the insulating layer on the semiconductor element side is an adhesive layer.

11. The manufacturing method according to claim 8, wherein a wafer substrate, which is the substrate of the semiconductor element in a wafer state, is provided with a through hole via that penetrates the substrate in its thickness direction, and the electrode of the semiconductor element is communicable to a back face side of the wafer substrate through the through hole via, and wherein the wiring circuit layer is laminated on either the back face or a front face of the wafer substrate, and an end of the through hole via and the connecting conductor part of the wiring circuit layer are connected.

12. The manufacturing method according to claim 8, wherein
in the forming step of the metal film, a gold layer and a nickel layer are formed sequentially by electroplating on the surface of the release layer exposed in the opening, which forms the metal film having a double-layer structure with an underlayer of the nickel layer and a surface layer of the gold layer on the surface of the externally-connecting conductor part of the wiring circuit layer.

* * * * *